(12) United States Patent
Singhal et al.

(10) Patent No.: US 12,248,252 B2
(45) Date of Patent: Mar. 11, 2025

(54) BUBBLE DEFECT REDUCTION

(71) Applicant: Lam Research Corporation, Fremont, CA (US)

(72) Inventors: Akhil N. Singhal, Portland, OR (US); Bart Jan van Schravendijk, Palo Alto, CA (US); Girish A. Dixit, San Jose, CA (US); David C. Smith, Lake Oswego, OR (US); Siva Krishnan Kanakasabapathy, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 524 days.

(21) Appl. No.: 17/293,000

(22) PCT Filed: Nov. 15, 2019

(86) PCT No.: PCT/US2019/061891
§ 371 (c)(1),
(2) Date: May 11, 2021

(87) PCT Pub. No.: WO2020/102783
PCT Pub. Date: May 22, 2020

(65) Prior Publication Data
US 2022/0004103 A1    Jan. 6, 2022

Related U.S. Application Data

(60) Provisional application No. 62/768,641, filed on Nov. 16, 2018.

(51) Int. Cl.
G03F 7/16      (2006.01)
G03F 7/20      (2006.01)
H01L 21/027    (2006.01)

(52) U.S. Cl.
CPC ............ *G03F 7/168* (2013.01); *G03F 7/2022* (2013.01); *H01L 21/027* (2013.01)

(58) Field of Classification Search
None
See application file for complete search history.

(56) References Cited

U.S. PATENT DOCUMENTS 1,054,748 A * 3/1913 Cook ...................... B21B 39/04
                                                      72/422
4,997,746 A   3/1991 Greco et al.
(Continued)

FOREIGN PATENT DOCUMENTS

CN    101038942 A  *  9/2007
CN    102610524 A      7/2012
(Continued)

OTHER PUBLICATIONS

Research disclosures RD 318038 (Sep. 1990) (abstract only).*
(Continued)

*Primary Examiner* — Martin J Angebrannndt
(74) *Attorney, Agent, or Firm* — Schwegman Lundberg & Woessner, P.A.

(57) ABSTRACT

In some examples, a method of processing a substrate comprises applying a photoresist (PR) onto a surface of the substrate, pre-exposing the PR to ultra violet (UV) light before depositing or etching a metal oxide (MO) layer onto the PR, and depositing or etching a MO layer onto the PR subsequent to pre-exposing the PR to UV light.

7 Claims, 2 Drawing Sheets

(56) References Cited

U.S. PATENT DOCUMENTS

| | | | | |
|---|---|---|---|---|
| 5,108,870 | A * | 4/1992 | Shalom | G03F 7/091 430/326 |
| 5,394,735 | A * | 3/1995 | Fang | G01N 33/005 73/31.06 |
| 5,679,610 | A * | 10/1997 | Matsuda | H01L 21/31051 257/E21.243 |
| 5,728,626 | A * | 3/1998 | Allman | H01L 21/288 257/E21.174 |
| 5,804,487 | A * | 9/1998 | Lammert | H01L 29/66318 438/944 |
| 5,962,192 | A * | 10/1999 | Holman, III | B41C 1/1008 430/326 |
| 6,074,893 | A * | 6/2000 | Nakata | H05K 3/207 29/877 |
| 6,420,101 | B1 * | 7/2002 | Lu | H01L 21/0274 430/394 |
| 10,546,748 | B2 * | 1/2020 | Yu | H01L 21/0337 |
| 2005/0095535 | A1 * | 5/2005 | Iwai | G03F 7/0397 430/270.1 |
| 2009/0136877 | A1 | 5/2009 | Suganuma | |
| 2010/0112483 | A1 * | 5/2010 | Wing Ngai | H01L 21/0338 430/296 |
| 2010/0209855 | A1 * | 8/2010 | Tanaka | H01L 21/0274 430/319 |
| 2010/0227282 | A1 * | 9/2010 | Shirley | G03F 7/2022 430/326 |
| 2011/0250540 | A1 * | 10/2011 | Huang | G03F 7/70466 430/296 |
| 2012/0064463 | A1 * | 3/2012 | Park | G03F 7/0392 430/326 |
| 2012/0100722 | A1 * | 4/2012 | Asai | H01L 21/0217 438/758 |
| 2014/0367833 | A1 * | 12/2014 | Brink | H01L 21/0338 257/618 |
| 2015/0316857 | A1 | 11/2015 | Berry, III et al. | |
| 2016/0336178 | A1 * | 11/2016 | Swaminathan | C23C 16/45542 |
| 2017/0243991 | A1 | 8/2017 | Li et al. | |
| 2018/0033653 | A1 * | 2/2018 | Cheng | H01L 21/67115 |
| 2018/0061650 | A1 * | 3/2018 | Mahorowala | H10B 12/01 |
| 2018/0240667 | A1 * | 8/2018 | Yu | H01L 21/465 |
| 2019/0237341 | A1 * | 8/2019 | Yu | C23C 16/401 |
| 2022/0208551 | A1 * | 6/2022 | Heo | H01L 21/467 |

FOREIGN PATENT DOCUMENTS

| | | | | |
|---|---|---|---|---|
| CN | 103794475 | A * | 5/2014 | H01L 21/0337 |
| CN | 113016053 | | 6/2021 | |
| JP | 02118653 | A * | 5/1990 | |
| JP | 03183134 | A * | 8/1991 | |
| JP | 0719780 | B2 * | 3/1995 | |
| JP | 2002040251 | A * | 2/2002 | |
| JP | 2004020820 | A * | 1/2004 | |
| JP | 2004354433 | A * | 12/2004 | |
| JP | 2006108564 | A * | 4/2006 | |
| JP | 2006162841 | A * | 6/2006 | |
| JP | 2008268178 | A * | 11/2008 | B01J 19/0046 |
| JP | 2014056187 | A * | 3/2014 | |
| JP | 2015189155 | A * | 11/2015 | |
| JP | 2018037656 | A | 3/2018 | |
| KR | 100216732 | B1 | 9/1999 | |
| KR | 20060081454 | A | 7/2006 | |
| KR | 100669344 | B1 | 1/2007 | |
| KR | 101388998 | B1 * | 4/2014 | |
| WO | WO-2017209177 | A1 * | 12/2017 | C08G 73/10 |
| WO | WO-2018181049 | A1 * | 10/2018 | G09F 9/00 |

OTHER PUBLICATIONS

"Resist Process" in IBM technical disclosure Bulletin (Jun. 1972) (Year: 1972).*

"International Application Serial No. PCT US2019 061891, International Preliminary Report on Patentability mailed May 27, 2021", 5 pages.

International Application Serial No. PCT/US2019/061891, International Search Report mailed Mar. 13, 2020, 3 pgs.

International Application Serial No. PCT/US2019/061891, Written Opinion mailed Mar. 13, 2020, 3 pgs.

Chinese Application Serial No. 201980075195.7, Office Action mailed Jun. 21, 2024, w/ English translation, 13 pgs.

* cited by examiner

BUBBLE DEFECT REDUCTION

This application is a U.S. National Stage Filing under 35 U.S.C. 371 from International Application No. PCT/US2019/061891, filed on Nov. 15, 2019, and published as WO 2020/102783 A1 on May 22, 2020, which claims the benefit of priority to U.S. Patent Application No. 62/768,641, to Singhal et al, entitled "Bubble Defect Reduction" filed on Nov. 16, 2018, each of which is incorporated by reference herein in its entirety.

CLAIM OF PRIORITY

This application claims the benefit of priority to U.S. Patent Application No. 62/768,641, to Singhal et al, entitled "Bubble Defect Reduction" filed on Nov. 16, 2018, which is incorporated by reference herein in its entirety.

FIELD

The present disclosure relates generally to bubble defect reduction in depositing and/or etching a metal oxide (MO) layer on a photoresist on a substrate.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Atomic Layer Deposition (ALD) is a deposition method that has the capability of controlling the thickness of thin films formed on semiconductor substrates on the order of one atomic mono-layer. Plasma Enhanced ALD (PEALD) is a further enhancement that enables improved film properties at lower temperatures. PEALD uses chemical precursors, like ALD, in an RF-induced plasma to create the necessary chemical reactions to form the thin films in a highly controlled manner. PEALD offers many advantages, including low temperature processing, excellent conformity and thickness control of deposited layers, and a capability of pre- and post-deposition in-situ treatments.

Multiple patterning is a technique to enhance feature density for integrated circuits (ICs) beyond the limits of photolithography. Such multi-patterning techniques include, for example, pitch splitting, sidewall image transfer, self-aligned contacts, via patterning, layout splitting, and self-aligned double or quadruple patterning. It is expected that multi-patterning will be necessary for 10 nm and 7 nm node semiconductor processes and beyond.

Self-Aligned Quadruple Patterning (SAQP) is essentially two cycles of a double patterning technique, often referred to as Self-Aligned Double Patterning (SADP). Both SAQP and SADP require a substrate with multiple layers formed thereon. For instance, the layers on the substrate may include, from the bottom layer up, a first carbon film referred to as an Ashable Hard Mask (AHM) or a Spin on Carbon layer (SOC), a Silicon Oxide ($SiO_2$) layer, a second carbon (AHM/SOC) layer, and an Anti-Reflective Layer (ARL).

SADP uses a photolithography step and additional etch steps to define spacer-like features on a substrate. In the SADP process, the first step is to deposit a resist material (also called a photoresist, or photoresist layer, referred to as PR herein) and then pattern, using photolithography, "mandrels" onto the top ARL layer on the substrate. The mandrels typically have a pitch at or close to the limit of photolithography. The mandrels are next covered with a deposition layer such as Silicon Oxide ($SiO_2$). A "spacer etch" is subsequently performed, removing (a) the horizontal surfaces of the $SiO_2$ layer and (b) the PR. As a result, just the vertical surfaces of the $SiO_2$ remain on the ARL layer. These vertical surfaces define "spacers," which have a pitch finer than can be achieved with conventional photolithography.

SAQP is a continuation of the double patterning process. With SAQP, the $SiO_2$ spacers are used as a mask in an etch step removing the underlying ARL and second AHM layers except under the masked regions. Thereafter, the $SiO_2$ spacers are removed, leaving second mandrels formed in the AHM layer. Another $SiO_2$ layer is then deposited followed by another "spacer etch," removing (a) the horizontal portions of the $SiO_2$ layer and (h) the second mandrels. The result is a structure having $SiO_2$ spacers formed on the underlying $SiO_2$ layer, With the SAQP process, the pitch of the second $SiO_2$ spacers are finer than the first spacers and significantly beyond limits of conventional lithography.

While multi-patterning offers significant benefits and helps extend the usefulness of conventional photolithography to next generation integrated circuitry, the various processes have their limitations. In particular, the multi-patterning requires numerous deposition, photolithography, and catching steps to form the spacers. The finer the pitch of the spacers, generally the more photolithography-etch cycles are involved. These additional steps significantly add to the cost and complexity of semiconductor fabrication.

As semiconductor manufacturers increasingly look to adopt SAQP and SADP towards shrinking nodes even further, they are also looking at ways to reduce the cost of adopting this technology. One potential way to do so is to adopt a MO to form spacers and deposit these directly on top of the PR layer, MO is harder and of higher modulus than conventional silicon dioxide and allows thinner spacers to be created and used and can also provide the benefit of being able to be used in a second role as a second mandrel. This approach of using a MO spacer to serve initially as a spacer followed thereafter by its use as mandrel is called spacer-on-spacer technology. Certain methods of spacer-on-spacer technology that achieve a requisite SAQP performance can be very beneficial cost-wise as they can eliminate many deposition, lithography, and etching steps and thus serve to pay for the cost advantage of this technology.

As part of this spacer-on-spacer technology, certain MOs can be used as spacer material to be deposited directly on top of a PR layer. Some examples have demonstrated that this can be done without causing damage to the PR material. But in some instances, particularly when performing a spacer etch on certain wafers, significant detects can arise. One problem relates to the creation of unwanted bubble defects. The present disclosure seeks to address at least this issue.

DESCRIPTION OF THE DRAWINGS

Some embodiments are illustrated by way of example and not limitation in the figures of the accompanying drawings.

DESCRIPTION

Figure 1:
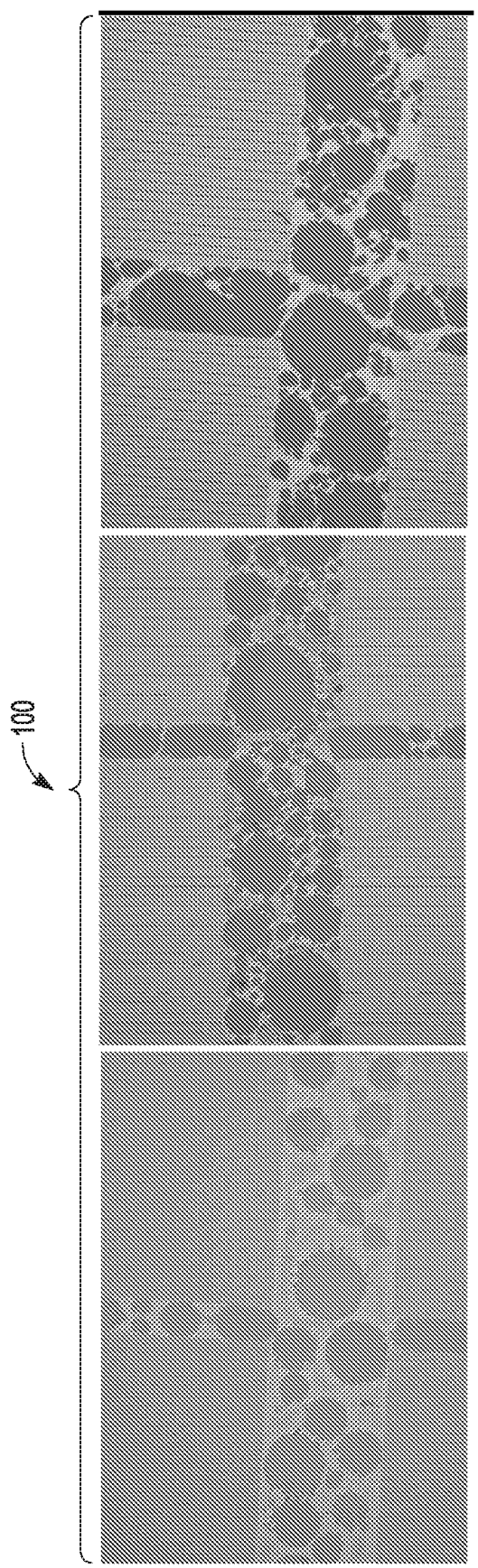
FIG. 1 is a schematic diagram showing bubble defects, according to some examples.

The description that follows includes systems, methods, and techniques that embody illustrative embodiments of the present disclosure. In the following description, for purposes of explanation, numerous specific details are set forth in order to provide a thorough understanding of example embodiments. It will be evident, however, to one skilled in the art that the present inventive subject matter may be practiced without these specific details.

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to the software and data as described below and in the drawings that form a part of this document: Lam Research Corporation 2018-2019, All Rights Reserved.

As mentioned above, bubble defect formation can be an issue in certain semiconductor manufacturing operations. Current manufacturing techniques using spacers of silicon oxide ($SiO_2$) sometimes have limitations when scaling down to accommodate shrinking technology nodes. Other techniques involving MO spacers allow scalability in some examples but nevertheless present issues relating to the formation of bubble defects appearing in the PR layer during the etching of the MO downstream of a deposition phase. The presence of such defects during etching can limit or prevent the use of otherwise helpful. MOs such as tin oxide ($SnO_2$) from being used in smaller scale operations or in a second role serving as a mandrel on the PR layer.

Without wishing to be bound by theory, it is believed that bubble defect formation may be caused by an interaction of ultraviolet (UV) light or radiation present in a plasma gas with electrons emitted by a MO layer at the interface between the MO layer and a PR during a dry etch chemistry. In certain instances, the PR layer may be a positive tone PR which softens upon the application of UV in a curing process. When a MO is present on a PR layer, secondary electron emission from the MO layer is believed to interact with the positive tone PR and soften it under the action of the applied UV. Bubble defect formation can be particularly significant when using a high-emission MO such as tin oxide as this material has a very high secondary electron emission coefficient. It is believed that the softening of the PR layer leads to outgassing as the material breaks down, which forms bubble defects during curing. Schematic pictures of bubble defects appearing in three example panes 100 may be seen in FIG. 1 of the accompanying drawings.

Figure 2:
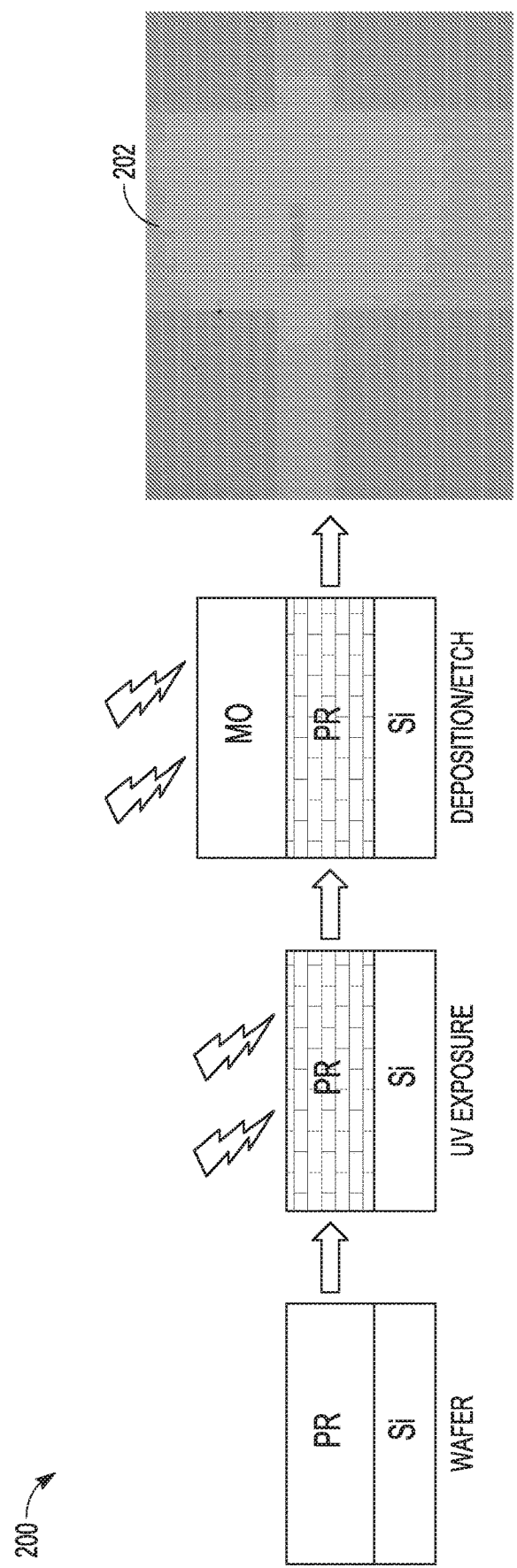
FIG. 2 is a block diagram illustrating operations in a method, according to an example embodiment.

In some examples, a UV precuring or pre-exposure operation is performed. With reference to FIG. 2, an example method 200 includes the performance of precuring or pre-exposure operations on a substrate such as a silicon wafer (Si) that includes a PR. A wafer including the PR is exposed to UV before a MO layer is deposited onto the PR. The precuring or pre-exposure operations may be performed in some examples during, or as a supplement to, an SAQP process, SADP process, or spacer-on-spacer process as described above. In some examples, a PR is exposed to UV light or radiation prior to deposition of a MO layer onto the PR and held immune to UV exposure by a plasma during or after deposition of the MO layer. Some tested examples using this method completely or at least substantially eliminated bubble defects form occurring, as shown in the example pane 202 in FIG. 2.

The preliminary or precuring UV exposure may be performed in an existing tool having a UV source, in an external chamber fitted with a UV source, or in a wafer-processing chamber having a plasma source, for example. Other arrangements are possible. A suitable plasma source may include helium, argon, or nitrogen in an amount sufficient to generate ITV for precuring purposes.

The above examples are merely exemplary and should not be considered limiting. Thus, in other examples, bubble defect reduction may be performed during, or in relation to, other phases in a semiconductor manufacturing operation. In some examples, bubble defect reduction including a precuring or pre-exposure operation is performed during or in relation to a deposition phase, a photolithography phase, an etching phase, or other wafer processing phase involving the use of plasma, for example. In some examples, bubble defect reduction including a precuring; or pre-exposure operation is performed during or in relation to a combination of phases.

Further, while some examples discussed above mention tin oxide as an example MO layer, the present disclosure may be employed on other types of films or layers, some of which may include MOs, metal nitrides, metal carbides, metal, and so forth. Further example layers or films also include dielectric material of metallic or non-metallic material. The example wafer described in relation to FIG. 2 includes a layer or film of silicon material (Si). Other components or materials making up, or being included in, the illustrated Si, PR and MO layers, are possible.

Thus, some embodiments may include one or more of the following examples.

1. A method of processing a substrate, the method comprising: applying a PR onto a surface of the substrate; pre-exposing the PR to UV light before depositing or etching a MO layer onto the PR; and depositing or etching a MO layer onto the PR subsequent to pre-exposing the PR to UV light.

2. The method of example 1, wherein depositing or etching a MO layer onto the PR is performed immediately subsequent to the pre-exposure of UV light.

3. The method of example 1 or 2, wherein the substrate includes a silicon wafer.

4. The method of any one of examples 1-3, wherein pre-exposing the PR to UV light is performed during, or as a supplement to, a Self-Aligned Quadruple Patterning (SAQP) process.

5. The method of any one of examples 1-4, wherein pre-exposing the PR to UV light is performed during, or as a supplement to, a Self-Aligned Double Patterning (SADP) process.

6. The method of any one of examples 1-5, wherein pre-exposing the PR to UV light is performed during, or as a supplement to, a spacer-on-spacer process.

7. The method of any one of examples 1-6, further comprising holding the PR immune to UV exposure during or after depositing or etching a MO layer onto the PR.

8. The method of anyone of examples 1-7, wherein holding the PR immune to UV exposure includes holding the PR immune to UV exposure by a plasma.

9. The method of any one of examples 1-8, wherein pre-exposing the PR to UV light before depositing or etching a MO later on-to the PR is performed in an existing substrate processing tool having a UV light source.

10. The method of any one of examples 1-9, wherein pre-exposing the PR to UV light before depositing or etching a MO later on-to the PR is performed in an external chamber fitted with a UV light source.

11. The method of any one of examples 1-10, wherein the substrate is processed in a substrate processing tool, the substrate processing tool including a plasma source for generating plasma, the plasma including a constituent in an amount sufficient to generate UV light for pre-exposing the PR to the UV light.

12. The method of example 11, wherein the plasma constituent includes one or more constituents including helium, argon, and nitrogen.

13. The method of any one of examples 1-12, wherein the MO layer includes tin oxide.

14. A method of processing a substrate, the method comprising: applying a PR onto a surface of the substrate; pre-exposing the PR to ultra violet (UV) light before depositing or etching a layer onto the PR; and depositing or etching a layer onto the PR subsequent to pre-exposing the PR to UV light.

15. The method of example 14, wherein the layer includes one or more of a MO layer, a metal nitride layer, a metal carbide layer, and a metal layer.

Although various embodiments and examples have been described with reference to specific example embodiments and examples, it will be evident that various modifications and changes may be made to these embodiments without departing from the broader scope of the disclosure. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments, Combinations of the above embodiments, and other embodiments not specifically described herein, will be apparent to those of skill in the art upon reviewing the above description.

The invention claimed is:

1. A method of precuring a semiconductor substrate, the method comprising:
    applying an un-patterned positive tone photoresist layer onto a surface of the semiconductor substrate;
    precuring the semiconductor substrate by pre-exposing the photoresist layer uniformly to a plasma consisting of at least one of helium, argon, or nitrogen which generates before depositing a metal oxide layer onto the photoresist layer, wherein the photoresist layer remains un-patterned after the pre-exposing of the photoresist layer to the ultraviolet light;
    creating patterned mandrels of the photoresist layer on the semiconductor substrate;
    depositing a metal oxide layer onto the patterned mandrels, wherein the metal oxide layer comprises tin oxide, the tin oxide emitting electrons that soften the photoresist layer causing bubble defects, wherein the pre-exposing of the photoresist layer to the ultraviolet light reduces the softening of the photoresist layer caused by the electrons, thereby reducing the bubble defects; and
    performing a spacer etch by etching the metal oxide layer to leave sidewall spacers of the metal oxide layer on the semiconductor substrate.

2. The method of claim 1, wherein the substrate includes a silicon wafer.

3. The method of claim 1, further comprising:
    covering the sidewall spacers of the metal oxide layer with a deposition layer; and
    performing a spacer etch to leave spacers of the deposition layer on the semiconductor substrate.

4. The method of claim 1, further comprising not exposing the photoresist layer to ultraviolet exposure during or after depositing or etching the metal oxide layer onto the photoresist layer.

5. The method of claim 4, wherein not exposing the photoresist layer to ultraviolet exposure includes not exposing the photoresist layer to ultraviolet exposure by a plasma.

6. The method of claim 1, wherein the substrate is processed in a substrate processing chamber, the substrate processing chamber including a plasma source for generating plasma, the plasma including a constituent in an amount sufficient to generate the ultraviolet light for pre-exposing the photoresist layer to the ultraviolet light, wherein the plasma reduces the bubble defects.

7. A method of precuring a semiconductor substrate, the method comprising: applying an un-patterned positive tone photoresist layer onto a surface of the semiconductor substrate; precuring the semiconductor substrate by pre-exposing the photoresist layer uniformly to a plasma consisting of at least one of helium, argon, or nitrogen which generates before depositing a layer onto the photoresist layer, wherein pre-exposing the photoresist layer reduces bubble defects and wherein the photoresist layer remains un-patterned after the pre-exposing of the photoresist layer to the ultraviolet light; creating patterned mandrels of the photoresist layer on the semiconductor substrate; depositing a metal oxide layer onto the patterned mandrels, wherein the metal oxide layer comprises tin oxide, the tin oxide emitting electrons that soften the photoresist layer causing bubble defects, wherein the pre-exposing of the photoresist layer to the ultraviolet light reduces the softening of the photoresist layer caused by the electrons, thereby reducing the bubble defects; and performing a spacer etch by etching the metal oxide layer to leave sidewall spacers of the metal oxide layer on the semiconductor substrate.

* * * * *